United States Patent
Chang et al.

(10) Patent No.: US 9,406,680 B1
(45) Date of Patent: Aug. 2, 2016

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Jr-Jung Lin, Hsinchu (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/698,831

(22) Filed: Apr. 28, 2015

Related U.S. Application Data

(60) Provisional application No. 62/116,321, filed on Feb. 13, 2015.

(51) Int. Cl.
| | |
|---|---|
| *H01L 27/092* | (2006.01) |
| *H01L 21/8238* | (2006.01) |
| *H01L 29/16* | (2006.01) |
| *H01L 21/306* | (2006.01) |
| *H01L 29/161* | (2006.01) |
| *H01L 29/06* | (2006.01) |
| *H01L 29/165* | (2006.01) |
| *H01L 29/66* | (2006.01) |
| *H01L 29/78* | (2006.01) |

(52) U.S. Cl.
CPC ...... *H01L 27/0924* (2013.01); *H01L 21/30604* (2013.01); *H01L 21/823814* (2013.01); *H01L 21/823821* (2013.01); *H01L 21/823878* (2013.01); *H01L 27/0922* (2013.01); *H01L 29/0649* (2013.01); *H01L 29/161* (2013.01); *H01L 29/165* (2013.01); *H01L 29/1608* (2013.01); *H01L 29/66636* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. | |
| 8,253,204 B2 * | 8/2012 | Lee | H01L 29/0847 257/288 |
| 8,362,575 B2 | 1/2013 | Kwok et al. | |
| 8,367,498 B2 | 2/2013 | Chang et al. | |
| 8,404,538 B2 * | 3/2013 | Lai | H01L 21/3247 257/190 |

(Continued)

OTHER PUBLICATIONS

Ozturk, M, "Source/Drain Junction and Contacts for 45 nm CMOS and Beyond" 2005 International Conference on Characterization and Metrology for ULSI Technology, Dallas Texas.*

*Primary Examiner* — Joseph Schoenholtz
(74) *Attorney, Agent, or Firm* — McDermott Will & Emery LLP

(57) ABSTRACT

A semiconductor device includes a Fin FET transistor. The Fin FET transistor includes a first fin structure extending in a first direction, a gate stack and a source and a drain. The gate stack includes a gate electrode layer and a gate dielectric layer, covers a portion of the fin structure and extends in a second direction perpendicular to the first direction. Each of the source and drain includes a stressor layer disposed over the fin structure. The stressor layer applies a stress to a channel layer of the fin structure under the gate stack. The stressor layer penetrates under the gate stack. A vertical interface between the stressor layer and the fin structure under the gate stack in a third direction perpendicular to the first and second directions includes a flat portion.

21 Claims, 13 Drawing Sheets

(56) References Cited

U.S. PATENT DOCUMENTS

| | | |
|---|---|---|
| 8,440,517 B2 | 5/2013 | Lin et al. |
| 8,497,180 B2 * | 7/2013 | Javorka ............... H01L 29/6653 257/190 |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 * | 9/2014 | Liu ................... H01L 29/66795 257/288 |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,076,869 B1 * | 7/2015 | Hu ....................... H01L 29/7848 |
| 2011/0068407 A1 | 3/2011 | Yeh et al. |
| 2013/0011983 A1 | 1/2013 | Tsai et al. |
| 2014/0252412 A1 | 9/2014 | Tsai et al. |
| 2015/0129983 A1 * | 5/2015 | Yu ....................... H01L 29/7848 257/401 |
| 2015/0255543 A1 * | 9/2015 | Cheng ................ H01L 29/1087 257/288 |
| 2015/0263138 A1 * | 9/2015 | Kim .................. H01L 29/66818 438/283 |
| 2015/0270398 A1 * | 9/2015 | Jacob ................. H01L 29/7849 257/401 |

* cited by examiner

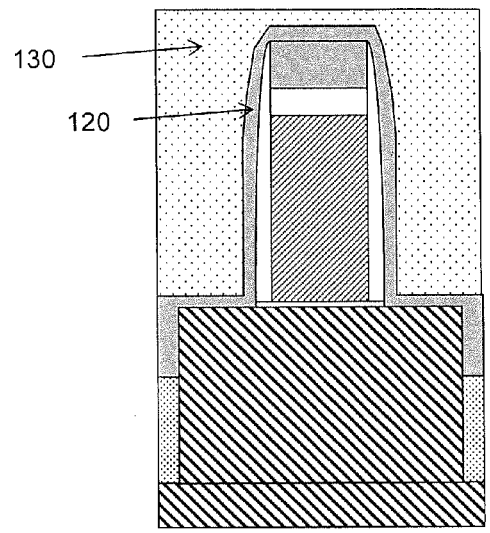 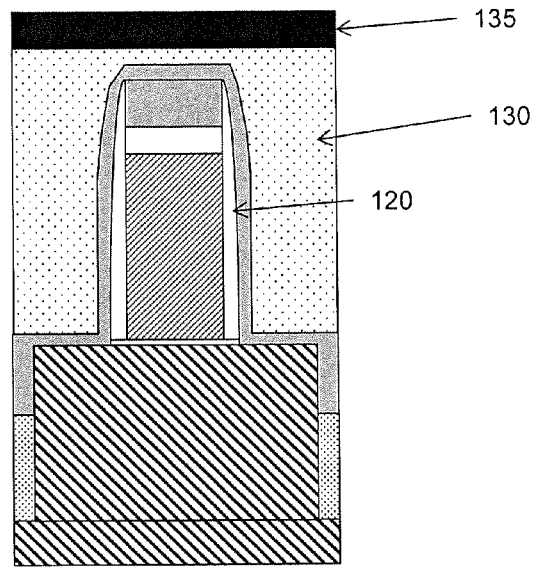
FIG. 8A  FIG. 8B
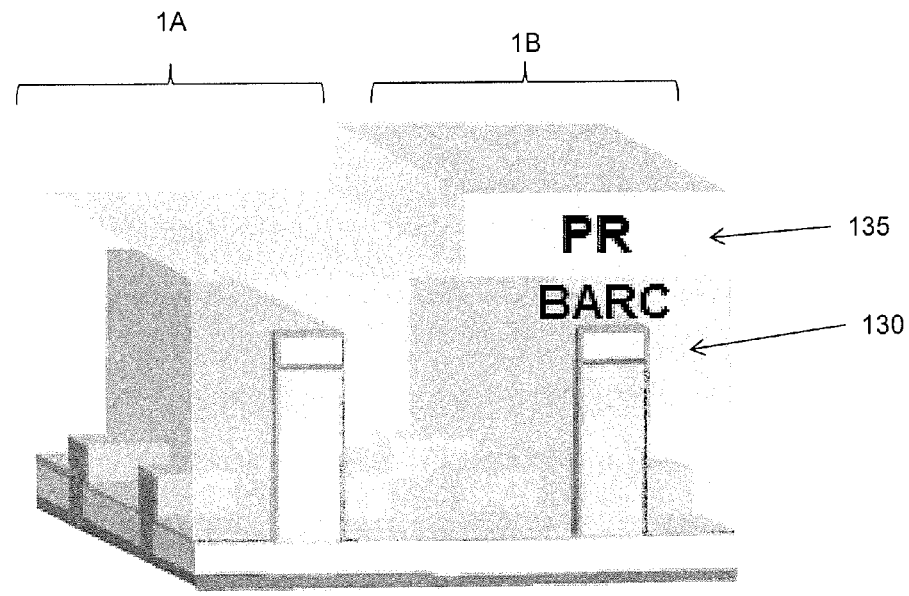
FIG. 8C

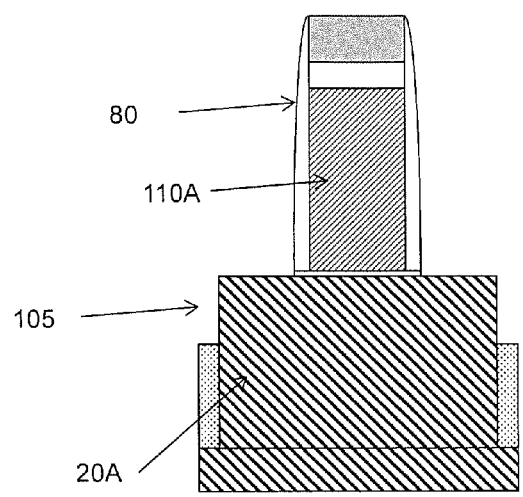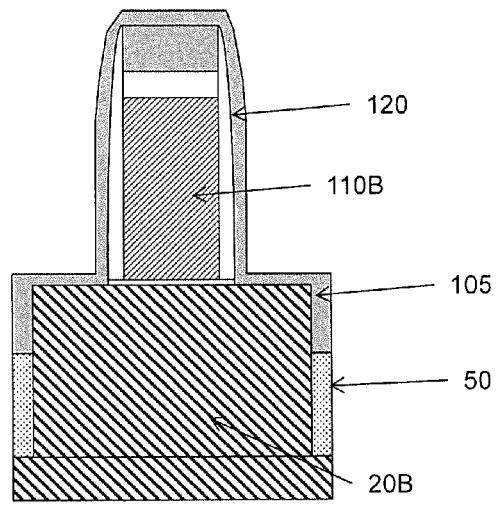
FIG. 9A          FIG. 9B
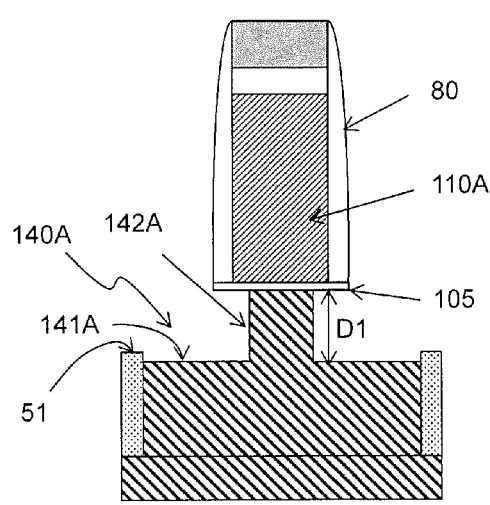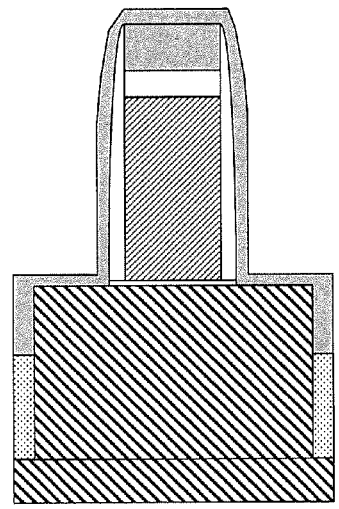
FIG. 10A         FIG. 10B

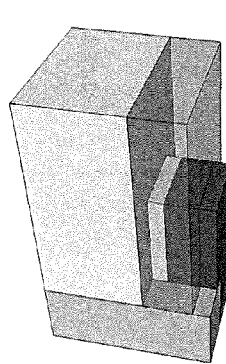 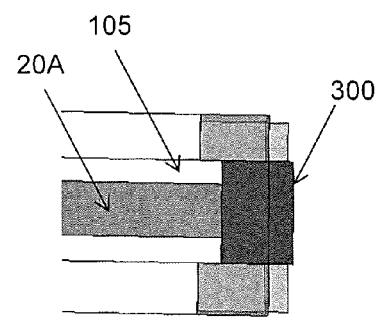 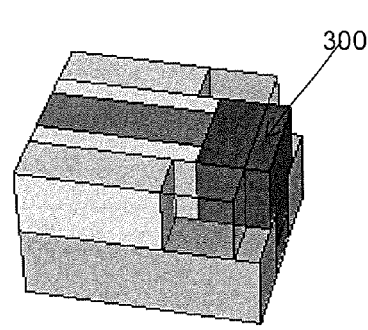
FIG. 13D　　　　FIG. 13E　　　　FIG. 13F
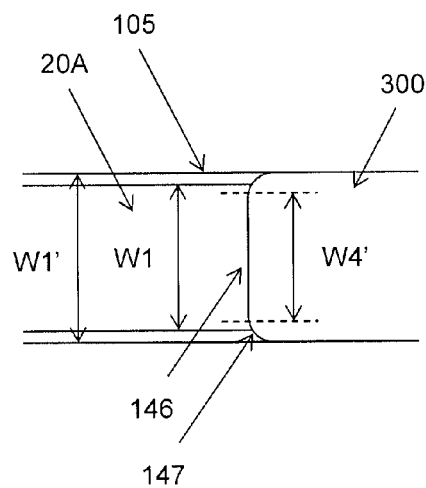
FIG. 13G

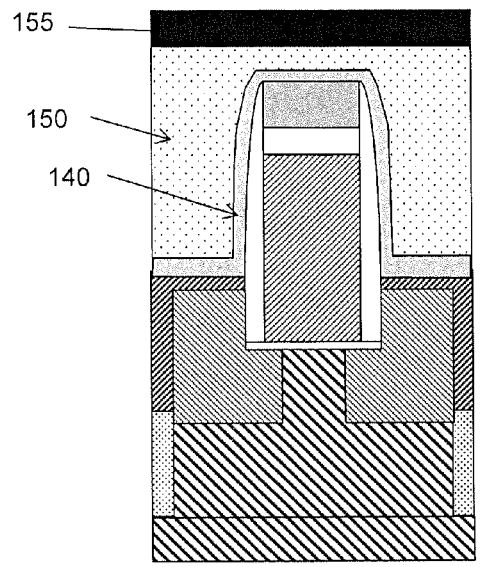
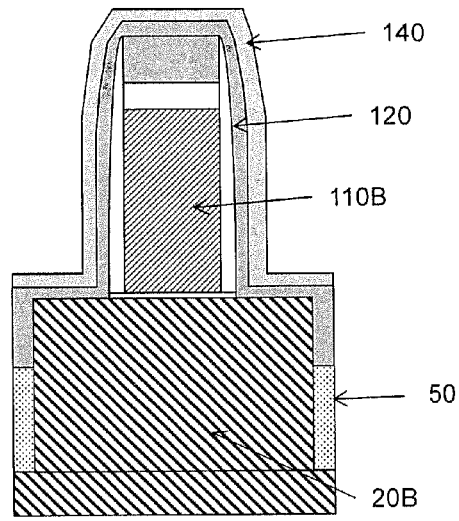
FIG. 14A    FIG. 14B
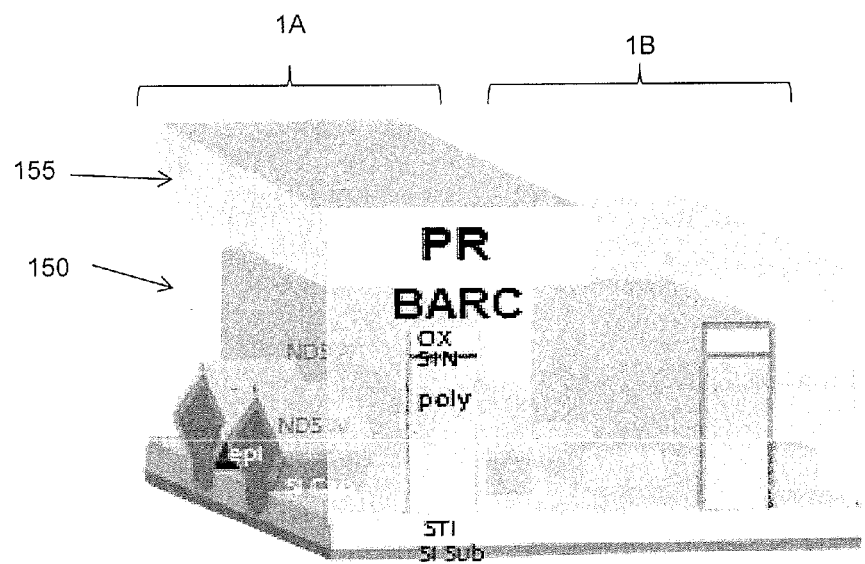
FIG. 14C

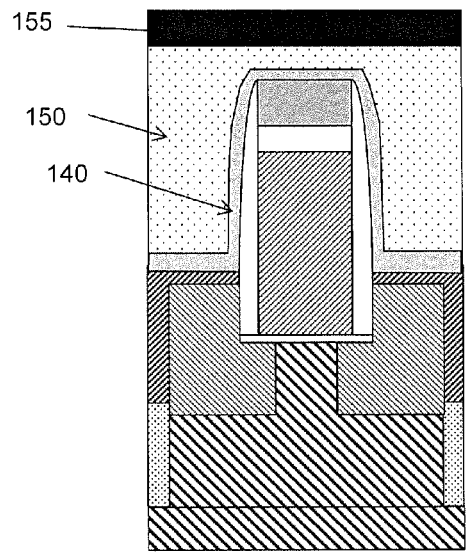
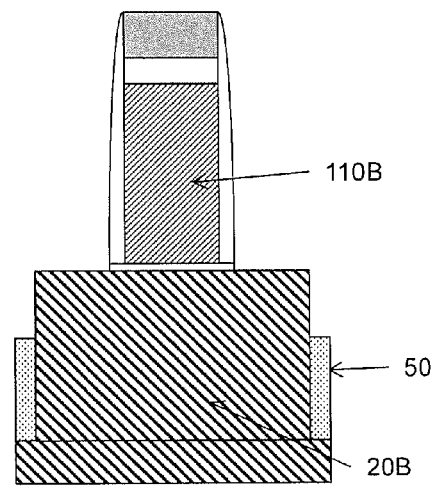
FIG. 15A   FIG. 15B
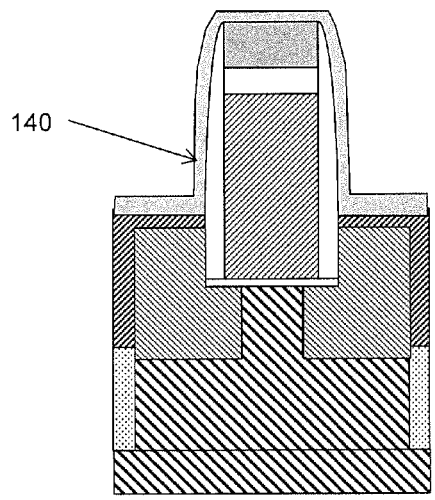
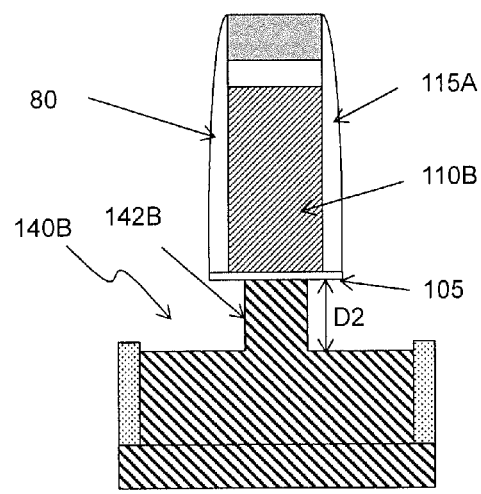
FIG. 16A   FIG. 16B

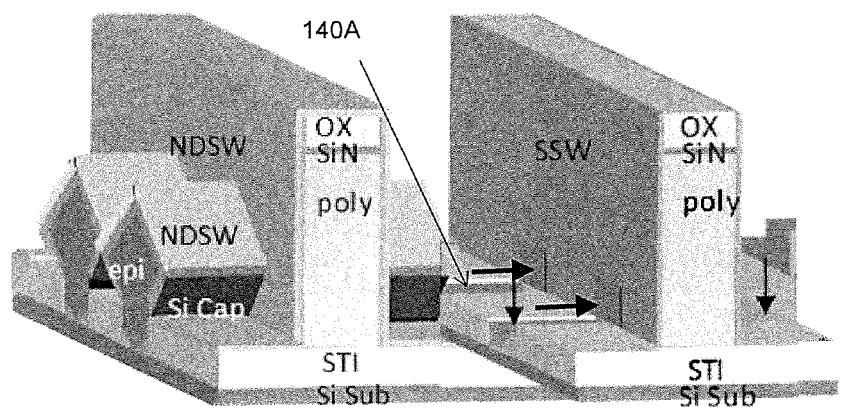
FIG. 16C
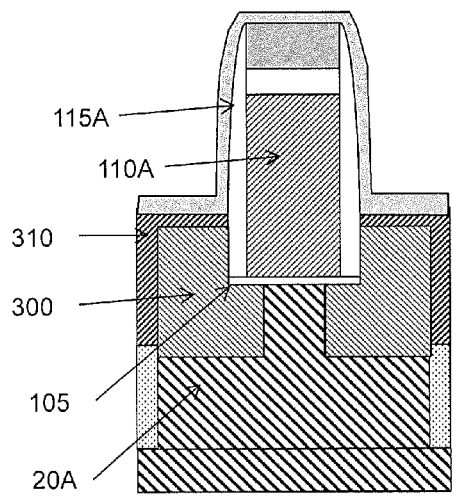 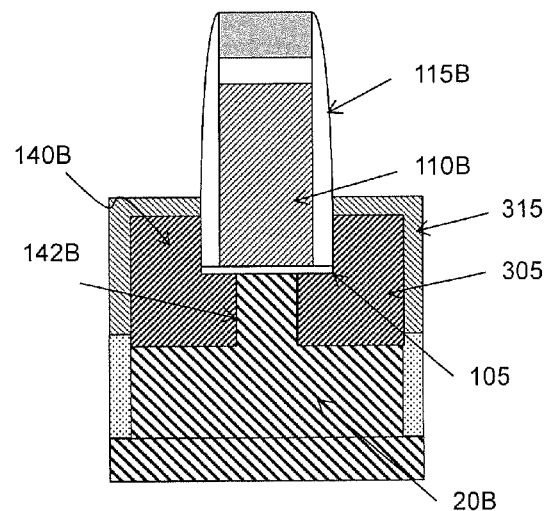
FIG. 17A  FIG. 17B

SEMICONDUCTOR DEVICE INCLUDING FIN STRUCTURES AND MANUFACTURING METHOD THEREOF

RELATED APPLICATIONS

This application claims the priority of U.S. Provisional Application No. 62/116,321 filed on Feb. 13, 2015, the entire contents of which application is incorporated herein by reference.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-17C show exemplary processes for manufacturing the Fin FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
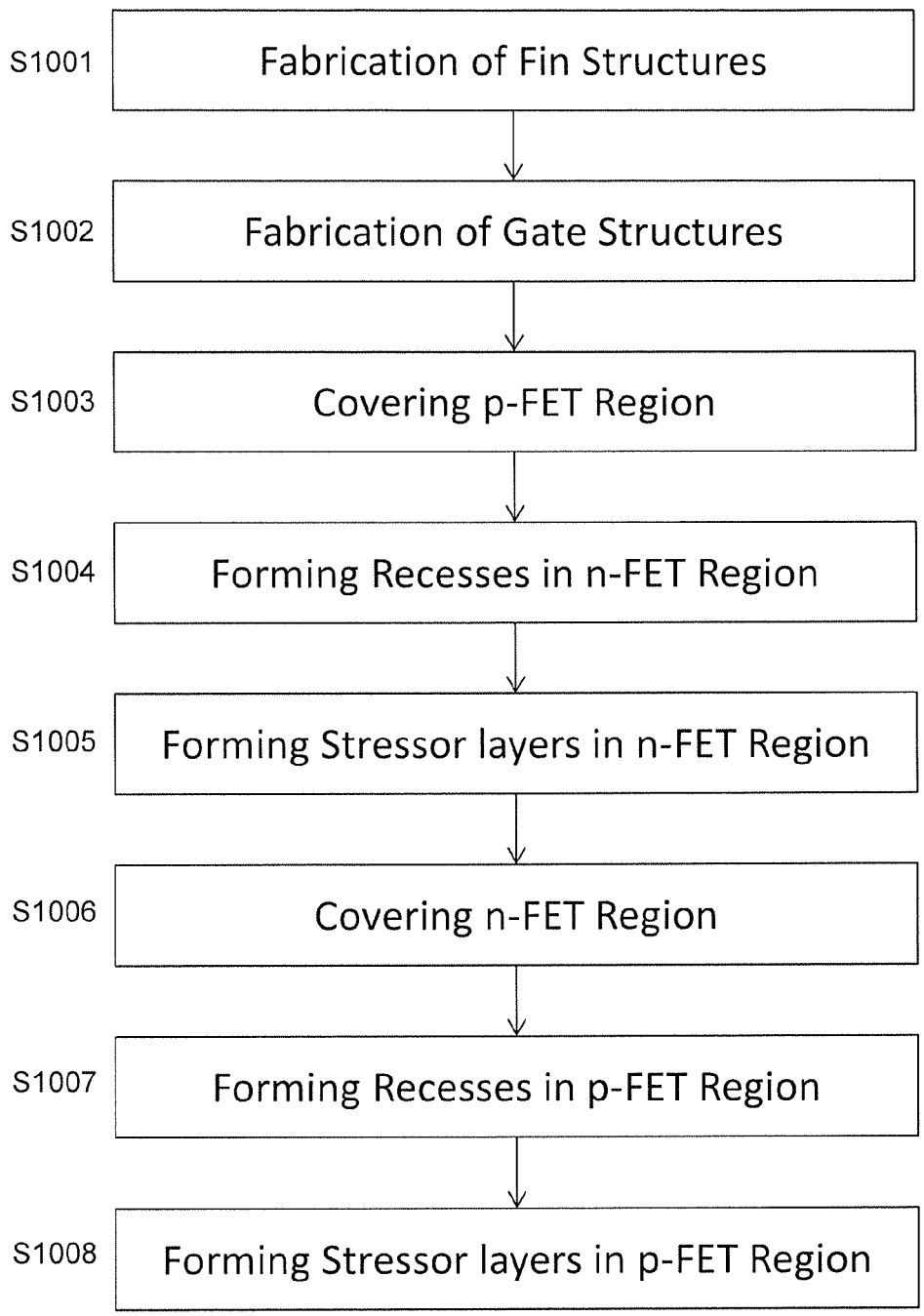
FIG. 1 is an exemplary process flow chart for manufacturing a semiconductor FET device having a fin structure (Fin FET)

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after processes shown by FIG. 1, and some of the operations described below can be replaced or eliminated, for additional embodiments of the method. The order of the operations/processes may be interchangeable. Further, the general operations for manufacturing a recessed S/D structure with strain materials (or stressor) in the fin structure are disclosed in U.S. Pat. No. 8,440,517, the entire contents of which are incorporated herein by reference.

In S1001, a fin structure is fabricated over a substrate. In S1002, a gate structure including a gate dielectric layer and a gate electrode is formed over a portion of the fin structure. In S1003, a region for a second type of FET, for example, a p-type FET, is covered by a covering layer to protect the region for the second type of FET from the subsequent processes for a first type of FET, for example an n-type FET. In S1004, the fin structure not covered by the gate structure is recessed. In S1005, a stressor layer is formed in the recessed portion of the fin structure. After forming the stressor structure for the first type of FET, in S1006, a region for the first type of FET is covered by a cover layer to protect the first type of FET with the stressor structure from the subsequent processes for the second type of FET. In S1007, the fin structure not covered by the gate structure for the second type of FET is recessed. In S1008, a stressor layer is formed in the recessed portion of the fin structure for the second type of FET. It is possible to process a p-type FET first and then process an n-type FET.

Referring to FIGS. 2-17C, the details of the exemplary manufacturing process of a Fin FET are described.

Figure 2:
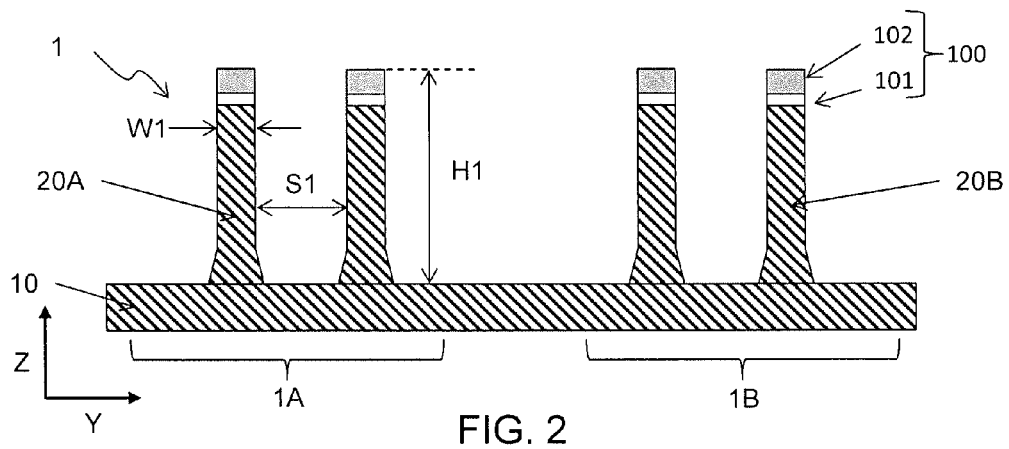

FIG. 2 is an exemplary cross sectional view of the Fin FET device 1 having a substrate 10 at one of the various stages of the fabrication process according to one embodiment.

To fabricate a fin structure, a mask layer is formed over the substrate 10 by, for example, a thermal oxidation process and/or a chemical vapor deposition (CVD) process. The substrate 10 is, for example, a p-type silicon substrate with an impurity concentration being in a range of about $1.12 \times 10^{15}$ $cm^{-3}$ and about $1.68 \times 10^{15}$ $cm^{-3}$. In other embodiments, The substrate 10 is an n-type silicon substrate with an impurity concentration being in a range of about $0.905 \times 10^{15}$ $cm^{-3}$ and about $2.34 \times 10^{15}$ $cm^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern 100 of the pad oxide layer 101 and the silicon nitride mask layer 102 is formed. The width of the hard mask pattern 100 is in a range of about 5 nm to about 40 nm in some embodiments. In certain embodiments, the width of the hard mask patterns 100 is in a range of about 7 nm to about 12 nm.

As shown in FIG. 2, by using the hard mask pattern 100 as an etching mask, the substrate 10 is patterned into fin structures 20 by trench etching using a dry etching method and/or a wet etching method. A height (in the Z direction) of the fin structure 20 is in a range of about 100 nm to about 300 nm. In certain embodiments, the height is in a range of about 50 nm to about 100 nm. When the heights of the fin structures are not uniform, the height from the substrate may be measured from the plane that corresponds to the average heights of the fin structures.

In this embodiment, a bulk silicon wafer is used as a starting material and constitutes the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIG. 2, two fin structures 20 are disposed adjacent to each other in the Y direction in the first device region 1A and in the second device region 1B, respectively. However, the number of the fin structures is not limited to two. The numbers may be one, three, four or five or more. In addition, one of more dummy fin structures may be disposed adjacent to both sides of the fin structures 20 to improve pattern fidelity in patterning processes. The width W1 of the fin structure 20 is in a range of about 5 nm to about 40 nm in some embodiments, and may be in a range of about 7 nm to about 15 nm in certain embodiments. The height H1 of the fin structure 20 is in a range of about 100 nm to about 300 nm in some embodiments, and may be in a range of about 50 nm to 100 nm in other embodiments. The space S1 between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

In this embodiment, the first device region 1A is for n-type Fin FETs and the second device region 1B is for p-type Fin FETs.

Figure 3:
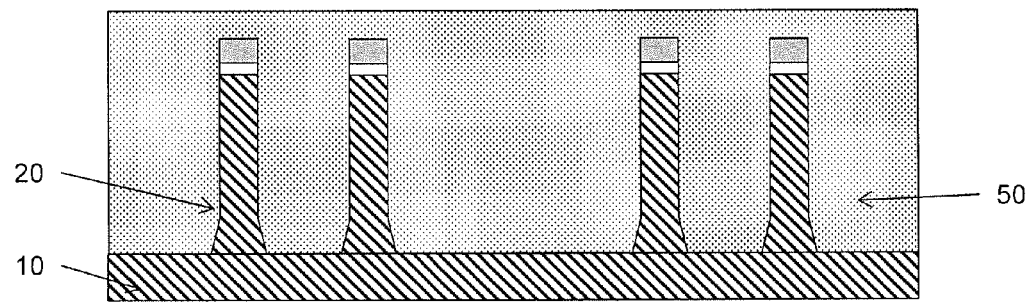

FIG. 3 is an exemplary cross sectional view of the Fin FET device 1 having fin structures 20 at one of the various stages of the fabrication process according to one embodiment.

As shown in FIG. 3, an isolation insulating layer 50 is formed over the substrate 10 so as to fully cover the fin structure 20.

The isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane(HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densities and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layer 50 may be formed by using SOG. SiO, SiON, SiOCN or fluoride-doped silicate glass (FSG) may be used as the isolation insulating layer 50 in some embodiments.

Figure 4:
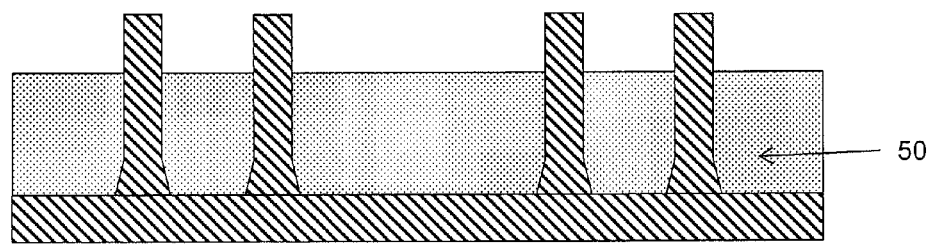

FIG. 4 is an exemplary cross sectional view of the Fin FET device 1 having fin structures 20 at one of the various stages of the fabrication process according to one embodiment.

After forming the isolation insulating layer 50, a planarization operation is performed so as to remove part of the isolation insulating layer 50 and the mask layer 100 (the pad oxide layer 101 and the silicon nitride mask layer 102). Then, the isolation insulating layer 50 is further removed so that an upper part of the fin structure 20, which is to become a channel layer, is exposed, as shown in FIG. 4. The planarization operation may include a chemical mechanical polishing (CMP) and/or an etch-back process.

In at least one embodiment, the silicon nitride layer 102 may be removed using a wet process using hot $H_3PO_4$, while pad oxide layer 101 may be removed using diluted HF acid, if formed of silicon oxide. In some alternative embodiments, the removal of the mask layer 100 may be performed after the recessing of the isolation insulating layer 50.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process, for example, the dry etching process using $CHF_3$ or $BF_3$ as etching gases.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 second to about 10 second in inert gas ambient, for example, $N_2$, Ar or He ambient.

Figure 5:
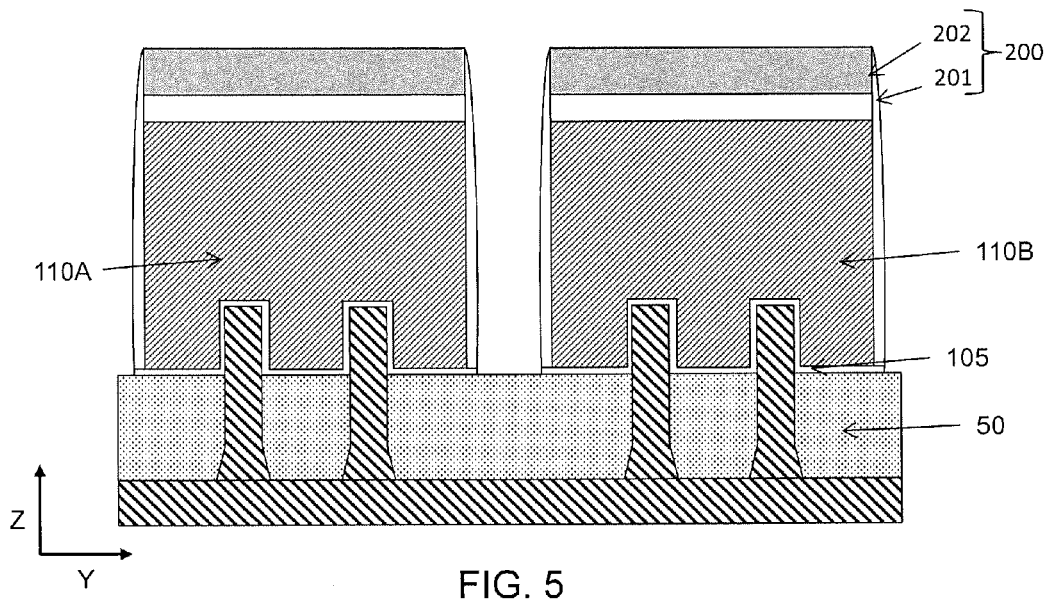
Figures 6A, 6B:
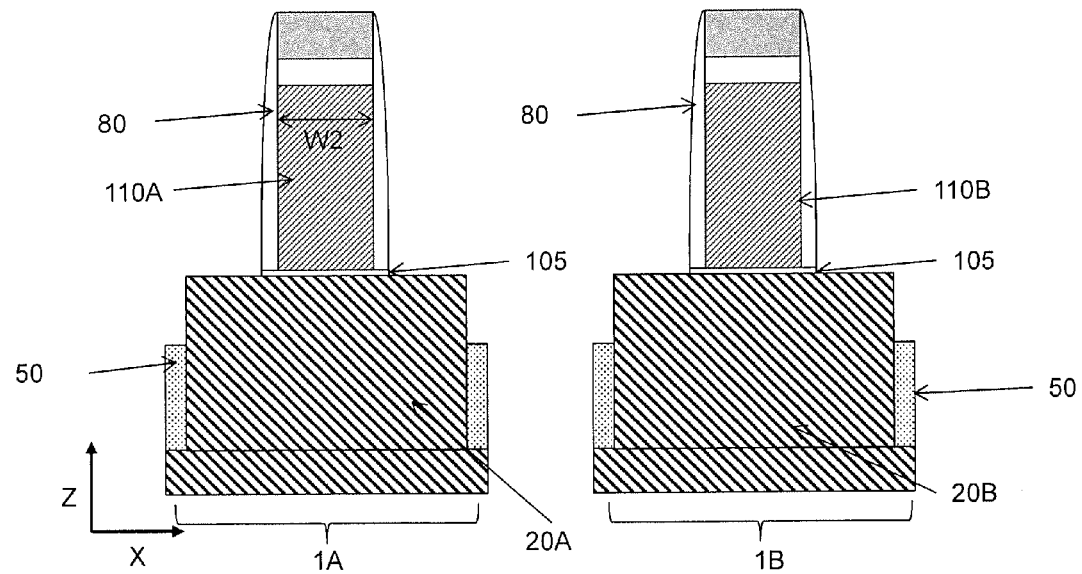

FIG. 5 is an exemplary cross sectional view of the Fin FET device 1 having fin structures 20 at one of the various stages of the fabrication process according to one embodiment. FIGS. 6A and 6B are exemplary cross sectional views along the direction (X direction) in which the fin structures extend.

A gate dielectric layer 105 and a poly silicon layer are formed over the isolation insulating layer 50 and the exposed fin structures 20, and then patterning operations are performed so as to obtain gate stacks including gate electrode layers 110A and 110B made of poly silicon and gate dielectric layer 105. The patterning of the poly silicon layer is performed by using a hard mask 200 including a silicon nitride layer 201 and an oxide layer 202 in some embodiments. In other embodiments, the layer 201 may be silicon oxide and the layer 202 may be silicon nitride. The gate dielectric layer 105 may be silicon oxide formed by CVD, PVD, ALD, e-beam evaporation, or other suitable process. In some embodiments, the gate dielectric layer 105 may include silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm.

In some embodiments, the gate electrode layers 110A and 110E may comprise a single layer or multilayer structure. In the present embodiment, the gate electrode layers 110A and 110B may comprise poly-silicon. Further, the gate electrode layers 110A and 110B may be doped poly-silicon with the uniform or non-uniform doping. In some alternative embodiments, the gate electrode layers 110A and 110B may include a metal such as Al, Cu, W, Ti, Ta, TiN, TiAl, TiAlN, TaN, NiSi, CoSi, other conductive materials with a work function compatible with the substrate material, or combinations thereof. The gate electrode layers 110A and 110B may be formed using a suitable process such as ALD, CVD, PVD, plating, or combinations thereof.

In the present embodiment, the width W2 of the gate electrode layers 110A and 110B is in the range of about 30 nm to about 60 nm in some embodiments.

Further, side-wall insulating layers 80 are also formed at both sides of the gate electrode layers 110A and 110B. The side-wall insulating layers 80 may include silicon oxide, silicon nitride, silicon oxy-nitride, or other suitable material. The side-wall insulating layers 80 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 80 on two sides of the gate stack. The thickness of the side-wall insulating layers 80 is in a range of about 5 nm to about 15 nm in some embodiments. In certain embodiments, the side-wall insulating layers 80 may not be formed at this stage.

Figures 7A, 7B:
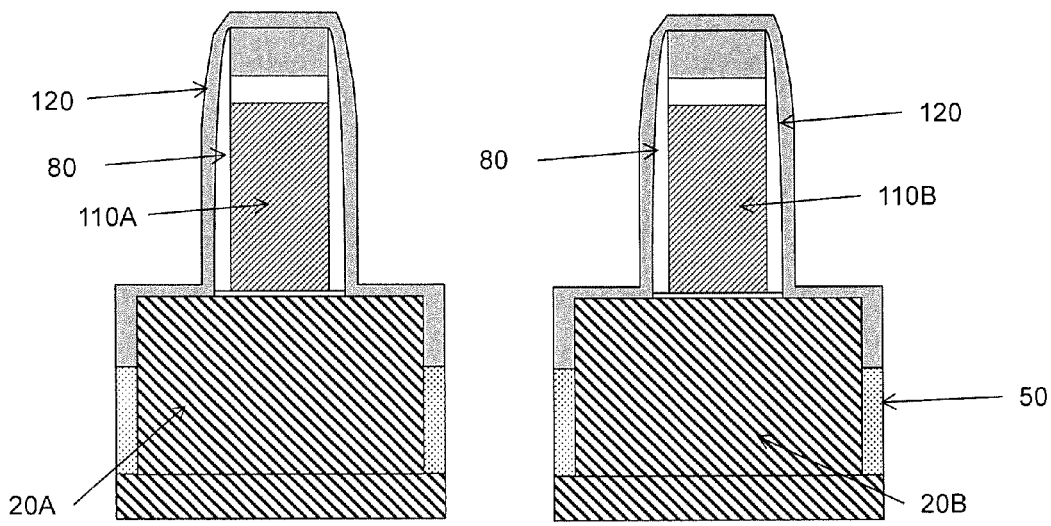
Figure 7C:
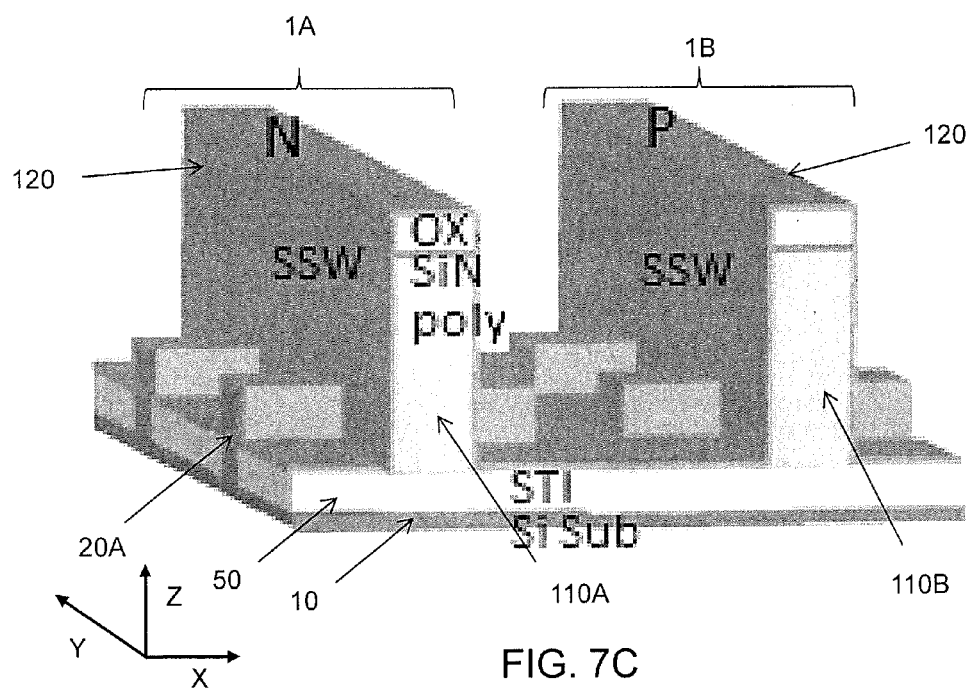

FIGS. 7A and 7B are exemplary cross sectional views and FIG. 7C is an exemplary perspective view of the Fin FET device 1 having gate structures over fin structures at one of the various stages of the fabrication process according to one embodiment.

As shown in FIGS. 7A-7C, a cover layer 120 is formed over the gate structures and the fin structures in the first and second device regions. The cover layer 120 may include silicon nitride with a thickness in a range of about 5 nm to about 15 nm in some embodiments.

FIGS. 8A and 8B are exemplary cross sectional views and FIG. 8C is an exemplary perspective view of the Fin FET device 1 having gate structures over fin structures at one of the various stages of the fabrication process according to one embodiment.

As shown in FIGS. 8A-8C, a masking layer 130 is formed over the covering layer, and further a mask pattern 135 is formed over the masking layer 130 by using a lithographic process. The mask pattern 135 covers the second device region 1B as shown in FIGS. 8B and 8C. The masking layer 130 may include an organic material. In some embodiments, the masking layer includes a material used for a bottom anti-reflection coating (BARC) for a lithographic process. The mask pattern 135 may include a photo resist.

FIGS. 9A and 9B are exemplary cross sectional views of the Fin FET device 1 having gate structures over fin structures at one of the various stages of the fabrication process according to one embodiment.

By using the mask pattern 135, the masking layer 130 is etched, and by using the etched masking layer, the cover layer 120 in the first device region is etched. As shown in FIGS. 9A and 9B, the cover layer 120 in the first device region 1A is removed, while the cover layer still covers the second device region 1B to protect the second device region from the subsequent process for the first device region. In some embodiments, a single layer of photo resist is formed over the second device region 1B, and by using the photo resist layer as a mask, the cover layer 120 is etched. After the cover layer 120 is etched, the masking layer 130 (and the mask pattern 135, if it remains) is removed.

FIGS. 10A and 10B are exemplary cross sectional views of the Fin FET device 1 having fin structures 20 at one of the various stages of the fabrication process according to one embodiment.

The portions of the fin structure 20 not covered by the gate structure are recessed to form a recessed portion 140A of the fin structure 20. The recessed portion 140A is formed such that a top surface 141A is located below the top surface 51 of the isolation insulating layer 50.

In certain embodiments, using the pair of side-wall insulating layers 80 as hard masks, a biased etching process is performed to recess the top surface of the fin structure 20 that are unprotected or exposed to form the recessed portion 140A.

Figure 10C:
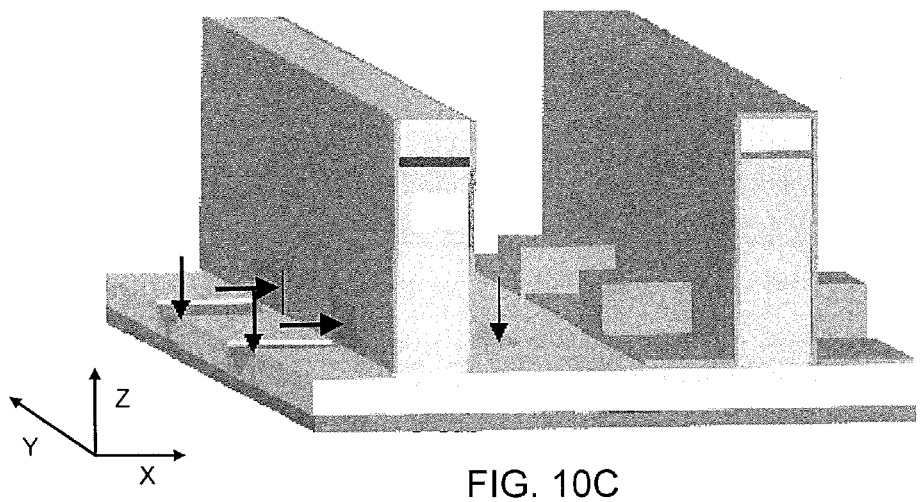

As shown in FIGS. 10A and 10C, a portion of the fin structure 20 under the gate stack is also etched. The depth D1 may be in a range of about 5 nm to about 10 nm in some embodiments. The end portion 142A may be located under the side-wall insulating layer 80, or in some other embodiments, the end portion 142A may be located under the gate electrode layer 110A.

In one embodiment of the present disclosure, the etching conditions in the recess etching process are adjusted to achieve desired profiles for the end portion 142A. For example, transform coupled plasma (TCP) with process gases including $CH_4$, $CHF_3$, $O_2$, HBr, He, $Cl_2$, $NF_3$, and/or $N_2$ is used with changing power and/or bias conditions. The TCP etching includes anisotropic etching followed by isotropic etching. In the isotropic etching, the bias voltage is set smaller than that in the anisotropic etching.

In one embodiment, the anisotropic etching is performed in the following two conditions. The etching in Condition 1 is followed by the etching in Condition 2.

|  | Pressure (mTorr) | Power (W) | Bias (V) | Temp (° C.) |
|---|---|---|---|---|
| Cond. 1 | 3~20 | 100~800 | 20~400 | 20~70 |
| Cond. 2 | 3~10 | 100~600 | 20~300 | 20~70 |

Figures 11A, 12A:
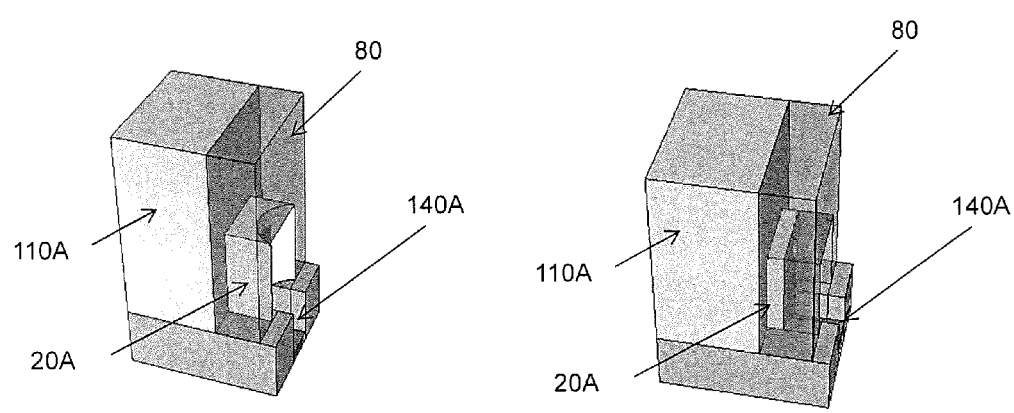
Figures 11B, 12B:
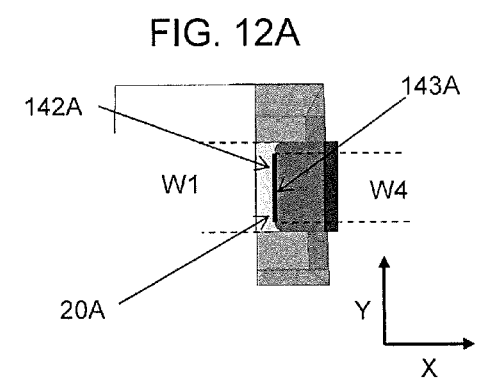

By the first and second anisotropic etching processes, the fin structures are recessed as shown in FIGS. 11A and 11B. As shown in FIGS. 11A and 11B, the end profile of the end portion 142A of the recessed portion 140A under the gate stack has roughly a rounded shape.

Further, the isotropic etching is performed in the following conditions.

|  | Pressure (mTorr) | Power (W) | Bias (V) | Temp (° C.) |
|---|---|---|---|---|
| Cond. 3 | 3~20 | 100~1500 | 5~50 | 20~70 |

By the isotropic etching, the end profile 142A of the recessed portion under the gate stack can have a flat surface 143A, as shown in FIGS. 12A and 12B.

The width W4 of the flat portion at the surface of the fin structure 20 in the recessed portion 140A along the Y direction may be in a range about $0.5 \times W1 \leq W4 \leq W1$ (the width of the fin structure 20). In some embodiments, W4 is in a range about $0.7 \times W1 \leq W4 < W1$.

It is noted that during the recess etching, the gate dielectric layer 105 disposed on the side of the fin structure 20 is also etched.

Figures 13A, 13B:
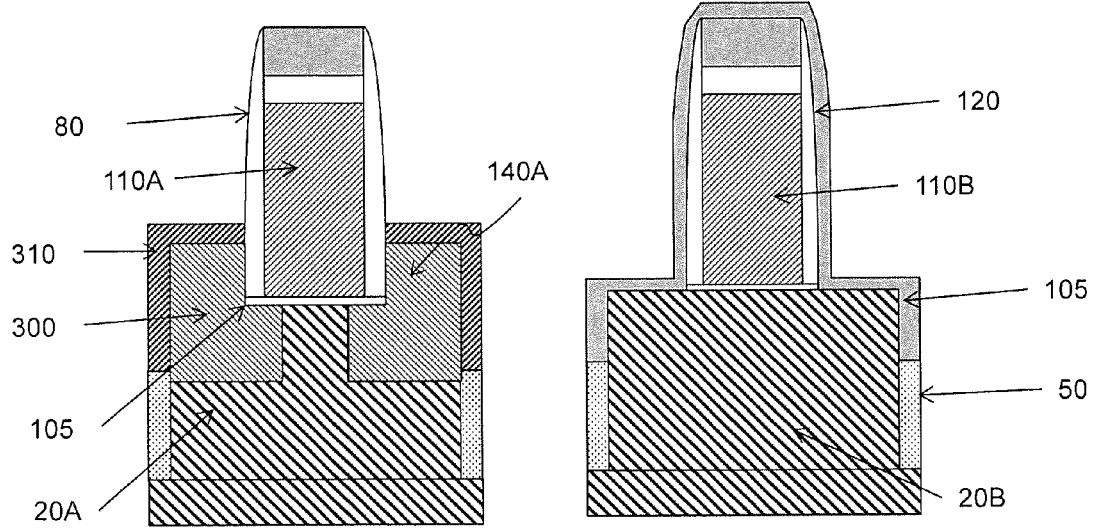
Figure 13C:
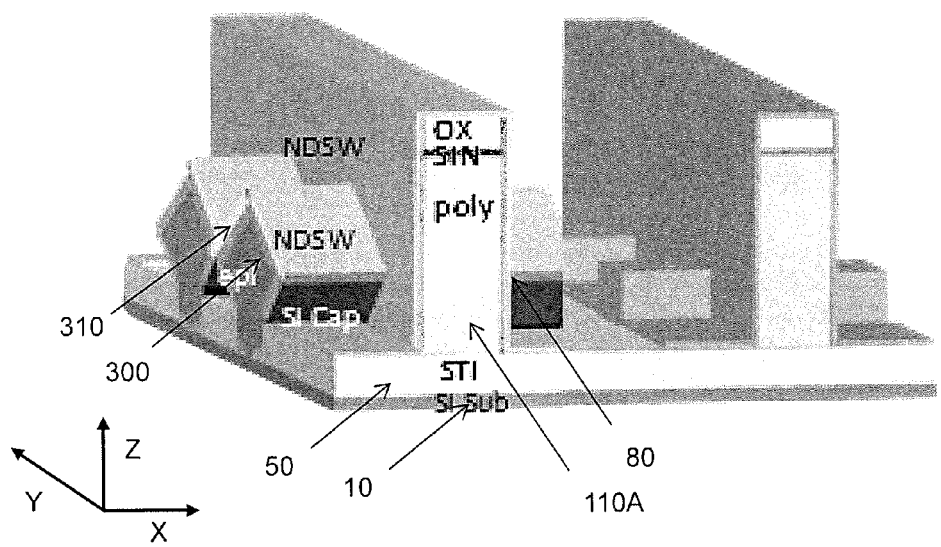

FIGS. 13A and 13B are exemplary cross sectional views and FIG. 13C is an exemplary perspective view of the Fin FET device 1 having gate structures over fin structures at one of the various stages of the fabrication process according to one embodiment.

In the recessed portion 140A, a first stressor layer 300 is formed. The first stressor layer 300 may be formed by selectively growing a strained material over the recessed portion 140A and above the isolation insulating layer 50. Since the lattice constant of the strained material is different from the fin structure 20 and the substrate 10, the channel region of the fin structure 20 is strained or stressed to increase carrier mobility of the device and enhance the device performance.

In at least one embodiment, the stressor layer 300, such as silicon carbon (SiC), is epitaxially-grown by an LPCVD process to form the source and drain regions of the n-type FinFET. The LPCVD process is performed at a temperature of about 400 to 800° C. and under a pressure of about 1 to 200 Torr, using $Si_3H_8$ and $SiH_3CH$ as reaction gases, in some embodiments.

In the present embodiment, the selective growth of the first stressor layer 300 continues until the material 300 extends vertically a distance ranging from about 10 to 100 nm from the bottom of the recessed portion 140A and extends laterally over the top surfaces of the isolation insulating layer 50. The formed first stressor layer 300 corresponds to source/drain of the n-type Fin FET.

When the end profile of the recessed portion 140A under the gate stack includes the flat surface 143A as shown in FIGS. 12A and 12B, the interface between the stressor layer 300 and the fin structure 20 also has a flat surface. More specifically, the interface may include a flat surface 146 and rounded portions 147, as shown in FIGS. 13D-13G. In some embodiments, the width W4' of the flat surface 146 is more than $0.5 \times W1$ (the width of the fin structure 20) and equal to or less than W1. In certain embodiment, W4' is about $0.7 \times W1$ or more, and yet in some other embodiments, W4' is about $0.8 \times W1$ or more. The maximum value of W4' is equal to or less than W1 and in some embodiments, $0.98 \times W1$ or less, and yet in some other embodiments, W4' is about $0.95 \times W1$ or less.

In certain embodiments, the width W4' of the flat portion is greater than W1 and less than W1'(=W1+thicknesses of gate dielectric layers 105 on both sides of the fin structure).

The larger the width W4 becomes, the more effectively the stressor layer 300 applies a stress to the channel layer.

Further, in some embodiments, a cap layer 310 is formed over the first stressor layer 300. When the first stressor layer 300 is SiC, the cap layer 310 is Si epitaxially-grown by an LPCVD process. The cap layer 310 enhances an application of the stress by the first stressor layer 300 to the channel layer.

After the Fin FETs in the first device region 1A (e.g., n-type Fin FETs) are formed, the Fin FETs in the second device region 1B are processed in a similar matter to the first device region.

FIGS. 14A and 14B are exemplary cross sectional views and FIG. 14C is an exemplary perspective view of the Fin FET device 1 having fin structures 20 at one of the various stages of the fabrication process according to one embodiment.

Similar to FIGS. 7A and 7B, a cover layer 140 is formed over the gate structures and the fin structures in the first and second device regions. The cover layer 140 may include silicon nitride with a thickness in a range of about 5 nm to about 15 nm in some embodiments.

Similar to FIGS. 8A-8C, a masking layer 150 is formed over the covering layer 140, and further a mask pattern 155 is formed over the masking layer 150 by using a lithographic process. The mask pattern 155 covers the first device region 1A as shown in FIGS. 14A and 14C. The masking layer 150 may include an organic material. In some embodiments, the masking layer 150 includes a material used for a bottom anti-reflection coating (BARC) for a lithographic process. The mask pattern 155 may include a photo resist.

FIGS. 15A and 15B are exemplary cross sectional views of the Fin FET device 1 having fin structures 20 at one of the various stages of the fabrication process according to one embodiment.

Similar to FIGS. 9A and 9B, by using the mask pattern 155, the masking layer 150 is etched, and by using the etched masking layer 150, the cover layers 120 and 140 in the second device region are etched. As shown in FIGS. 15A and 15B, the cover layers 120 and 140 in the second device region 1B are removed, while the cover layer 140 still covers the first device region 1A to protect the first device region from the subsequent process for the second device region. In some embodiments, a single layer of photo resist is formed over the first device region 1A, and by using the photo resist layer, the cover layers 120 and 140 in the second device region are etched. After the cover layer 120 and 140 are etched, the masking layer 150 (and the mask pattern 155, if it remains) is removed.

FIGS. 16A and 16B are exemplary cross sectional views and FIG. 16C is an exemplary perspective view of the Fin FET device 1 having fin structures 20 at one of the various stages of the fabrication process according to one embodiment.

Similar to FIG. 10A, a portion of the fin structure 20 under the gate stack in the second device region is etched. The depth D2 may be in a range of about 5 nm to about 10 nm in some embodiments. The end portion 142B may be located under the side-wall insulating layer 80, or in some embodiments, the end portion 142B may be located under the gate electrode layer 110B.

In the present embodiment, the etching conditions in the etching process are adjusted to achieve desired profiles for the recessed portion 140B. Similar to the recess etching for the recessed portion 140A, anisotropic etching followed by isotropic etching is used. By the isotropic etching, the end profile 142B of the recessed portion under the gate stack can include a flat surface 143A, as shown in FIGS. 12A and 12B.

Figure 17C:
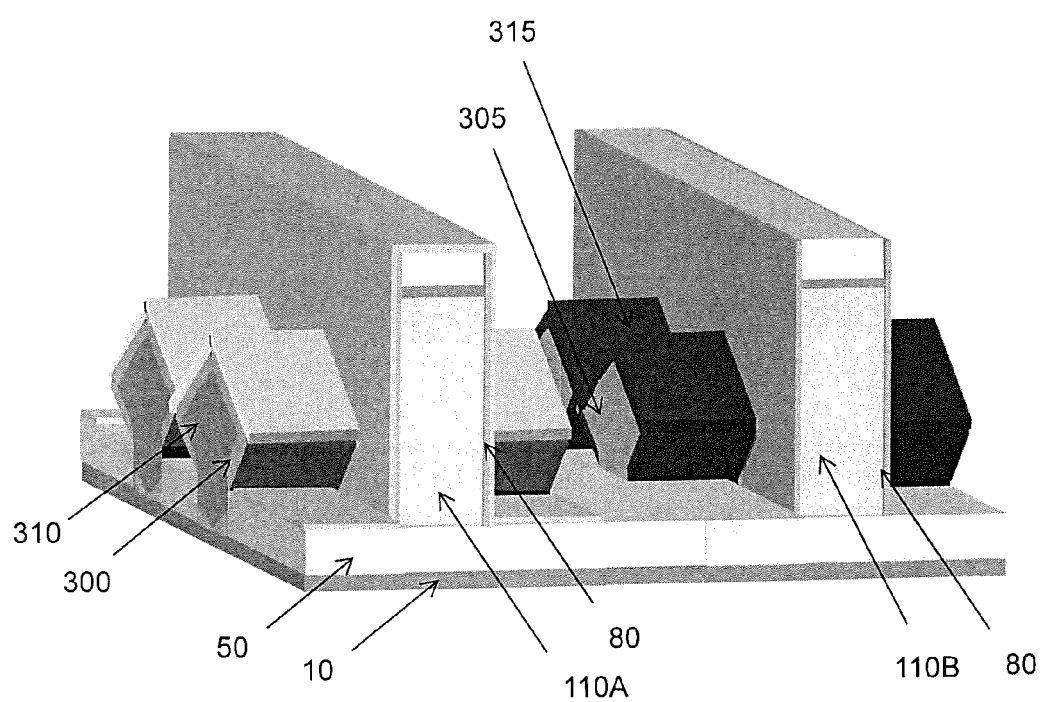

FIGS. 17A and 17B are exemplary cross sectional views and FIG. 17C is an exemplary perspective view of the Fin FET device 1 having gate structures over fin structures at one of the various stages of the fabrication process according to one embodiment.

In the recessed portion 140B, a second stressor layer 305 is formed. The second stressor layer 305 may be formed by selectively growing a strained material over the recessed portion 140B and above the isolation insulating layer 50. Since the lattice constant of the second strained material is different from the fin structure 20 and the substrate 10, the channel region of the fin structure 20 is strained or stressed to enable carrier mobility of the device and enhance the device performance.

In at least one embodiment, the second stressor layer 305, such as silicon germanium (SiGe), is epitaxially-grown by a LPCVD process to form the source and drain regions of the p-type Fin FET. The LPCVD process is performed at a temperature of about 400 to 800° C. and under a pressure of about 1 to 200 Torr, using $SiH_4$ and $GeH_4$ as reaction gases, in some embodiments.

In the present embodiment, the selective growth of the second stressor layer 305 continues until the material 305 extends vertically a distance ranging from about 10 to 100 nm from the bottom of the recessed portion 140B and extends laterally over the top surfaces of the isolation insulating layer 50. The formed second stressor layer 305 corresponds to source/drain of the p-type Fin FET.

When the profile 142B of the recessed portion 140B under the gate stack includes the flat surface similar to FIGS. 12A and 12B, the interface between the second stressor layer 305 and the fin structure 20 also has a flat surface. More specifically, the interface may include a flat surface and rounded portions, similar to FIG. 13G. In some embodiments, the width of the flat surface is more than 0.5×W1 (the width of the fin structure 20) and less than W1. In certain embodiment, the width of the flat surface is about 0.7×W1 or more, and yet in some other embodiments, the width of the flat surface is about 0.8×W1 or more. The maximum value of width of the flat surface is less than W1 and in some embodiments, 0.98×W1 or less, and yet in some embodiments, is about 0.95×W1 or less.

The greater the width of the flat surface becomes, the more effectively the second stressor layer 305 applies a stress to the channel layer.

Further, in some embodiments, a second cap layer 315 is formed over the second stressor layer 305. When the second stressor layer 305 is SiGe, the second cap layer 315 is Si epitaxially-grown by an LPCVD process. The second cap layer 315 enhances application of the stress by the second stressor layer 305 to the channel layer.

It is understood that the Fin FETs in the first and second device regions may undergo further CMOS processes to form various features such as contacts/vias, interconnect metal layers, dielectric layers, passivation layers, etc. The modified insulation and strained structure provides a given amount of strain into channel region of a Fin FET, thereby enhancing the device performance.

The various embodiments or examples described herein offer several advantages over the existing art. For example, by providing a flat portion in the interface between the stressor layer and the fin structure under the gate stack, the stress is more appropriately applied to the channel layer. In particular, the larger the width of the flat interface becomes, the more appropriately the stressor layer applies a stress to the channel layer.

It will be understood that not all advantages have been necessarily discussed herein, no particular advantage is required for all embodiments or examples, and other embodiments or examples may offer different advantages.

In accordance with one aspect of the present disclosure, a semiconductor device includes a first Fin FET transistor. The first Fin FET transistor includes a first fin structure extending in a first direction, a first gate stack, and first source and drain. The first gate stack includes a first gate electrode layer and a first gate dielectric layer, covers a portion of the first fin structure and extends in a second direction perpendicular to the first direction. Each of the first source and first drain includes a first stressor layer disposed over the first fin structure. The first stressor layer applies a stress to a channel layer of the first fin structure under the first gate stack. The first stressor layer penetrates under the first gate stack. A vertical interface between the first stressor layer and the first fin structure under the first gate stack in a third direction perpendicular to the first and second directions includes a first flat portion.

In accordance with another aspect of the present disclosure, a method for manufacturing a semiconductor device includes forming a gate stack including a gate electrode layer and a gate dielectric layer over a fin structure. A bottom of the fin structure is covered by an isolation insulating layer. A recessed portion is formed by removing a portion of the fin structure not covered by the gate stack and a part of the fin structure under the gate stack. After the recessed portion is formed, a bottom of the recessed portion is located below an upper surface of the isolation insulating layer, and the recessed portion penetrates under the gate stack. A stressor layer is formed in the recessed portion. The fin structure extends in a first direction and the gate stack extends in a second direction perpendicular to the first direction. In the forming the recessed portion, a vertical end face of the recessed portion on the fin structure under the gate stack in a third direction perpendicular to the first and second directions includes a flat portion.

In accordance with another aspect of the present disclosure, a method for manufacturing a semiconductor device includes forming a first gate stack including a first gate electrode layer and a first gate dielectric layer over a first fin structure, a bottom of the first fin structure being covered by an isolation insulating layer. A second gate stack including a second gate electrode layer and a second gate dielectric layer is formed over a second fin structure. A bottom of the second fin structure is covered by the isolation insulating layer. The second gate stack and the second fin structure are covered by forming a first covering layer. A first recessed portion is formed by removing a portion of the first fin structure not covered by the first gate stack and a part of the first fin structure under the first gate stack. A bottom of the first recessed portion is located below an upper surface of the isolation insulating layer, and the first recessed portion penetrates under the first gate stack. A first stressor layer is formed in the recessed portion. Then, the first gate stack and the first fin structure with the first stressor layer are covered by forming a second covering layer, and the second gate stack and the second fin structure are exposed by removing the first covering layer. A second recessed portion is formed by removing a portion of the second fin structure not covered by the second gate stack and a part of the second fin structure under the second gate stack. A bottom of the second recessed portion is located below an upper surface of the isolation insulating layer, and the second recessed portion penetrates under the second gate stack. A second stressor layer is formed in the second recessed portion. The first fin structure extends in a first direction and the first and second gate stacks extend in a second direction perpendicular to the first direction. In the forming the first recessed portion, a vertical end part of the first recessed portion on the first fin structure under the first gate stack in a third direction perpendicular to the first and second directions includes a first flat portion. In the forming the second recessed portion, a vertical end part of the second recessed portion on the second fin structure under the second gate stack in the third direction includes a second flat portion.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first Fin FET transistor including:
a first fin structure extending in a first direction;
a first gate stack including a first gate electrode layer and a first gate dielectric layer, covering a portion of the first fin structure and extending in a second direction perpendicular to the first direction; and
a first source and a first drain, each including a first stressor layer disposed over the first fin structure, the first stressor layer applying a stress to a channel layer of the first fin structure under the first gate stack, wherein:
the first stressor layer penetrates under the first gate stack,
a vertical interface between the first stressor layer and the first fin structure under the first gate stack in a third direction perpendicular to the first and second directions includes a first flat portion, and
a width W1 of the first fin structure under the first gate stack along the second direction and a width W2 of the first flat portion along the second direction satisfy $0.5 \times W1 \leq W2 \leq W1$.

2. The semiconductor device of claim 1, wherein the W1 and W2 satisfy $0.7 \times W1 \leq W2 \leq 0.95 \times W1$.

3. A semiconductor device, comprising:
a first Fin FET transistor including:
a first fin structure extending in a first direction;
a first gate stack including a first gate electrode layer and a first gate dielectric layer, covering a portion of the first fin structure and extending in a second direction perpendicular to the first direction; and
a first source and a first drain, each including a first stressor layer disposed over the first fin structure, the first stressor layer applying a stress to a channel layer of the first fin structure under the first gate stack, wherein:
the first stressor layer penetrates under the first gate stack,
a vertical interface between the first stressor layer and the first fin structure under the first gate stack in a third direction perpendicular to the first and second directions includes a first flat portion, and
a width W1 of the first fin structure under the first gate stack along the second direction and a width W2 of the first flat portion along the second direction satisfy $W1 \leq W2 < W1 + 2 \times T$, where T is a thickness of the first gate dielectric layer.

4. The semiconductor device of claim 1, wherein the first fin structure includes Si and the first stressor layer includes SiC.

5. The semiconductor device of claim 4, wherein the first source and first drain each further include a first cap layer including Si disposed over the first stressor layer.

6. The semiconductor device of claim 1, wherein the first fin structure includes Si and the first stressor layer includes SiGe.

7. The semiconductor device of claim 6, wherein the first source and first drain each further include a first cap layer including Si disposed over the first stressor layer.

8. A method for manufacturing a semiconductor device, comprising:
forming a gate stack including a gate electrode layer and a gate dielectric layer over a fin structure, a bottom of the fin structure being covered by an isolation insulating layer;
forming a recessed portion by removing a portion of the fin structure not covered by the gate stack and a part of the fin structure under the gate stack, such that a bottom of the recessed portion is located below an upper surface of the isolation insulating layer, and the recessed portion penetrates under the gate stack;
forming a stressor layer in the recessed portion, wherein:
the fin structure extends in a first direction and the gate stack extends in a second direction perpendicular to the first direction, and
in the forming the recessed portion, a vertical end face of the recessed portion on the fin structure under the gate stack in a third direction perpendicular to the first and second directions includes a flat portion.

9. The method of claim 8, wherein a width W1 of the fin structure under the gate stack along the second direction and a width W3 of the flat portion of the recessed portion along the second direction satisfy $0.5 \times W1 \leq W3 \leq W1$.

10. The method of claim 8, wherein after forming the stressor layer, a vertical interface between the stressor layer and the fin structure under the gate stack includes a flat portion.

11. The method of claim 10, wherein a width W1 of the fin structure under the gate stack along the second direction and a width W2 of the flat portion of the vertical interface along the second direction satisfy $0.5 \times W1 \leq W2 \leq W1$.

12. The method of claim 10, wherein a width W1 of the fin structure under the gate stack along the second direction and a width W2 of the flat portion of the vertical interface along the second direction satisfy $W1 \leq W2 < W1 + 2 \times T$, where T is a thickness of the gate dielectric layer.

13. The method of claim 8, wherein the forming a recessed portion includes anisotropic etching followed by isotropic etching.

14. A method for manufacturing a semiconductor device, comprising:

forming a first gate stack including a first gate electrode layer and a first gate dielectric layer over a first fin structure, a bottom of the first fin structure being covered by an isolation insulating layer;

forming a second gate stack including a second gate electrode layer and a second gate dielectric layer over a second fin structure, a bottom of the second fin structure being covered by the isolation insulating layer;

covering the second gate stack and the second fin structure by forming a first covering layer;

forming a first recessed portion by removing a portion of the first fin structure not covered by the first gate stack and a part of the first fin structure under the first gate stack, such that a bottom of the first recessed portion is located below an upper surface of the isolation insulating layer, and the first recessed portion penetrates under the first gate stack;

forming a first stressor layer in the recessed portion;

covering the first gate stack and the first fin structure with the first stressor layer by forming a second covering layer, and exposing the second gate stack and the second fin structure by removing the first covering layer;

forming a second recessed portion by removing a portion of the second fin structure not covered by the second gate stack and a part of the second fin structure under the second gate stack, such that a bottom of the second recessed portion is located below an upper surface of the isolation insulating layer, and the second recessed portion penetrates under the second gate stack; and forming a second stressor layer in the second recessed portion, wherein:

the first fin structure extends in a first direction and the first and second gate stacks extend in a second direction perpendicular to the first direction, in the forming the first recessed portion, a vertical end part of the first recessed portion on the first fin structure under the first gate stack in a third direction perpendicular to the first and second directions includes a first flat portion, and in the forming the second recessed portion, a vertical end part of the second recessed portion on the second fin structure under the second gate stack in the third direction includes a second flat portion.

15. The method of claim 14, wherein after forming the first stressor layer and the second stressor layer, at least one of a first vertical interface between the first stressor layer and the first fin structure under the first gate stack and a second vertical interface between the second stressor layer and the second fin structure under the first gate stack includes a flat interface portion.

16. The method of claim 15, wherein a width W2 of the flat interface portion along the second direction satisfies $0.5 \times W1 \leq W2 \leq W1$, where W1 is a width of a corresponding one of the first and second fin structures.

17. The method of claim 16, wherein a width W2 of the flat interface portion along the second direction satisfies $W1 \leq W2 < W1 + 2 \times T$, where W1 is a width of corresponding one of the first and second fin structures and T is a thickness of a corresponding one of the first and second gate dielectric layers.

18. The method of claim 14, wherein at least one of the forming the first recessed portion and the forming the second recessed portion includes anisotropic etching followed by isotropic etching.

19. The method of claim 14, wherein a first FET including the first gate stack has a different conduction type from a second FET including the second gate stack.

20. The semiconductor device of claim 1, wherein:
the first gate stack further includes a sidewall insulating layer disposed on a side face of the gate electrode layer, and
the vertical interface is located under the sidewall insulating layer.

21. The semiconductor device of claim 3, wherein:
the first gate stack further includes a sidewall insulating layer disposed on a side face of the gate electrode layer, and
the vertical interface is located under the sidewall insulating layer.

* * * * *